(12) United States Patent
Heo et al.

(10) Patent No.: US 8,120,096 B2
(45) Date of Patent: Feb. 21, 2012

(54) POWER SEMICONDUCTOR DEVICE AND METHOD OF MANUFACTURING THE SAME

(75) Inventors: Hong Pyo Heo, Gumi-si (KR); Keum Hwang, Gumi-si (KR)

(73) Assignee: KEC Corporation, Seoul (KR)

( * ) Notice: Subject to any disclaimer, the term of this patent is extended or adjusted under 35 U.S.C. 154(b) by 378 days.

(21) Appl. No.: 12/396,601

(22) Filed: Mar. 3, 2009

(65) Prior Publication Data

US 2009/0224310 A1 Sep. 10, 2009

(30) Foreign Application Priority Data

Mar. 6, 2008 (KR) .................. 10-2008-0021020

(51) Int. Cl.
*H01L 29/78* (2006.01)
*H01L 21/336* (2006.01)

(52) U.S. Cl. ........... 257/329; 257/E29.262; 257/E21.41; 257/335; 438/268

(58) Field of Classification Search .................. 257/329, 257/335
See application file for complete search history.

(56) References Cited

U.S. PATENT DOCUMENTS

2008/0157189 A1* 7/2008 Lee et al. ............... 257/329

FOREIGN PATENT DOCUMENTS

CN 101120448 2/2008

\* cited by examiner

*Primary Examiner* — Jarrett Stark
*Assistant Examiner* — Lawrence Tynes, Jr.
(74) *Attorney, Agent, or Firm* — Workman Nydegger

(57) ABSTRACT

A power semiconductor device capable of transmitting gate signals in all directions (e.g., up-/down-ward/right-/leftward) on a plane and a method of manufacturing the same. The power semiconductor device includes first conductive regions, formed to a predetermined depth in a surface of a conductive low concentration epitaxial layer. The first conductive regions include linear first conductive layers spaced from each other and linear second conductive layers spaced from each other. Second conductive regions are formed to a smaller width and depth than the first and second conductive layers to form channels in the first and second conductive layers. A gate oxide layer formed on a surface of the epitaxial layer defines first windows having a smaller width than the first conductive layers and second windows having a smaller width than the second conductive layers. A gate polysilicon layer is formed on the gate oxide layer.

14 Claims, 13 Drawing Sheets

POWER SEMICONDUCTOR DEVICE AND METHOD OF MANUFACTURING THE SAME

CROSS-REFERENCE TO RELATED APPLICATION

This application claims priority from Korean Patent Application No. 10-2008-0021020 filed on Mar. 6, 2008, in the Korean Intellectual Property Office, the disclosure of which is incorporated herein in its entirety by reference.

BACKGROUND OF THE INVENTION

1. Field of the Invention

The present invention relates to a power semiconductor device and a method of manufacturing the same.

2. Description of the Related Art

Generally, power semiconductor devices (for example, power MOSFETs (metal oxide semiconductor field-effect transistors) or IGBTs (insulated gate bipolar transistors)) are manufactured in a trench or planar type. Planar-type power semiconductor devices are used for switching-mode power supplies, DC-DC converters, electronic stabilizers for fluorescent lamps, inverters for motors, and others. They are required to have small switching/conduction loss and a sufficiently high break-down voltage. The use of these devices enables to reduce the size of final products due to higher energy efficiency and less heat generation, thereby achieving less consumption of resources.

In planar-type power semiconductor devices, unit cells are formed in a polygonal shape to increase a channel density per unit area, thereby leading to reduced drain-source on-resistance ($R_{ds(ON)}$). However, expendation type of the depletion area is spherical, when a high voltage is applied between a source and a drain in a turn-off state of the devices, a break-down voltage is unfavorably reduced.

In order to increase the break-down voltage of planar-type power semiconductor devices, it is necessary to increase the thickness and specific resistance of an epitaxial region, which inevitably increases drain-source on-resistance ($R_{ds(ON)}$). As such, there exists a trade-off relation between drain-source on-resistance ($R_{ds(ON)}$) and break-down voltage in planar-type power semiconductor devices, and thus, it is necessary to improve the structure of planar-type power semiconductor devices considering such a trade-off relation.

Meanwhile, planar-type power semiconductor devices are classified into a closed cell-type and a stripe-type.

In closed cell-type power semiconductor devices, a junction type between a P type conductive region and an N type epitaxial layer is approximately sphere surface, and thus, an Avalanche break-down voltage is decreased in an active region. In addition, a gate polysilicon layer and an N type epitaxial layer (drain-side drift region) face each other over a large area, which increases Miller capacitance. Therefore, a switching speed is lowered, and when high $dV_{DS}/dt$ is applied, a malfunction easily occurs.

In stripe-type power semiconductor devices, a junction type between a P type conductive region and an N type epitaxial layer is approximately cylinder surface, and thus, an Avalanche break-down voltage is increased in an active region. In addition, a gate polysilicon layer and an N type epitaxial layer (drain-side drift region) face each other over a small area, which decreases Miller capacitance. Therefore, a switching speed is increased, and when high $dV_{DS}/dt$ is applied, a malfunction is less likely to occur. In this regard, stripe-type power semiconductor devices have now been mainly manufactured, sold, and used.

Meanwhile, in both closed cell-type and stripe-type power semiconductor devices, gate signals are transmitted in all directions (e.g., up-/down-ward/right-/left-ward), and thus, there exists serious deviation in the transmission speed of the gate signals and the impedance of a gate driver circuit, among device elements.

In this regard, stripe-type power semiconductor devices are required to form gate bus lines using the same material as a source metal layer to connect gate polysilicon layers, which causes area loss and poor flow of a source current, thereby resulting in device degradation.

SUMMARY OF THE INVENTION

The present invention provides a power semiconductor device capable of transmitting gate signals in all directions (e.g., up-/down-ward/right-/left-ward) on a plane, which exhibits a reduced deviation in gate signal's transmission speed and impedance, an increased break-down voltage, and a reduced drain-source on-resistance ($R_{ds(ON)}$) and a method of manufacturing the same.

According to an aspect of the present invention, there is provided a power semiconductor device including: a conductive low concentration epitaxial layer; first conductive regions, formed to a predetermined depth in a surface of the epitaxial layer, including a plurality of linear first conductive layers spaced from each other by a predetermined distance and a plurality of linear second conductive layers spaced from each other by a predetermined distance, wherein opposite ends of the first conductive layers and the second conductive layers are alternately arranged with respect to each other and are spaced from each other by a predetermined distance; second conductive regions formed to a smaller width and depth than the first and second conductive layers so that channels are formed in the first and second conductive layers; a gate oxide layer formed on a surface of the epitaxial layer to define first windows having a smaller width than the first conductive layers and second windows having a smaller width than the second conductive layers; and a gate polysilicon layer formed on the gate oxide layer.

The epitaxial layer may be doped with an N– or P– type impurity.

The first conductive regions may be doped with a P or N type impurity.

The second conductive regions may be doped with an N or P type impurity.

The power semiconductor device may further include: a semiconductor substrate formed on a bottom surface of the epitaxial layer and doped with an N or P type impurity; and a drain metal layer formed on a bottom surface of the semiconductor substrate and doped with an N or P type impurity.

The power semiconductor device may further include: an insulating layer formed on surfaces of the gate oxide layer and the gate polysilicon layer to expose the first and second conductive regions; and a source metal layer formed on surfaces of the first and second conductive regions exposed by the insulating layer.

The opposite ends of the first conductive layers and the second conductive layers may be alternately arranged with respect to each other.

The opposite ends of the first conductive layers and the second conductive layers may be respectively aligned along two different imaginary lines.

The opposite ends of the first conductive layers and the second conductive layers may be aligned along a single imaginary line.

The opposite ends of the first conductive layers and the second conductive layers may be aligned to overlap with each other along a single imaginary line.

The opposite ends of the first conductive layers and the second conductive layers may be formed in a semi-circular shape on a plane.

The gate polysilicon layer may extend on a plane along an S-shaped path between the first windows and the second windows.

Opposite ends of the first windows and the second windows may be alternately arranged with respect to each other and be respectively aligned along two different imaginary lines.

Opposite ends of the first windows and the second windows may be alternately arranged with respect to each other and be aligned along a single imaginary line.

Opposite ends of the first windows and the second windows may be alternately arranged with respect to each other and be aligned to overlap with each other along a single imaginary line.

The epitaxial layer may be formed by sequential growth of an N+ type semiconductor and an N− type semiconductor on a P++ type semiconductor substrate.

The epitaxial layer may be formed by sequential growth of a P+ type semiconductor and a P− type semiconductor on an N++ type semiconductor substrate.

According to another aspect of the present invention, there is provided a power semiconductor device including: a conductive low concentration epitaxial layer; first conductive regions, formed to a predetermined depth in a surface of the epitaxial layer, including a plurality of linear first conductive layers spaced from each other by a predetermined distance, a plurality of linear second conductive layers spaced from each other by a predetermined distance, and a third conductive layer formed in a space defined between the first conductive layers and the second conductive layers to connect the first conductive layers and the second conductive layers, wherein opposite ends of the first conductive layers and the second conductive layers are alternately arranged with respect to each other and are spaced from each other by a predetermined distance; second conductive regions formed to a smaller width and depth than the first and second conductive layers so that channels are formed in the first and second conductive layers; a gate oxide layer formed on a surface of the epitaxial layer to define first windows having a smaller width than the first conductive layers and second windows having a smaller width than the second conductive layers; and a gate polysilicon layer formed on the gate oxide layer.

The first conductive regions may further include first body portions formed on both sides of the first conductive layers and second body portions formed on both sides of the second conductive layers, the first and second conductive layers may be doped with a high concentration impurity, and the first and second body portions may be doped with a low concentration impurity.

The third conductive layer may be doped with the same high concentration impurity as the first and second conductive layers.

The third conductive layer may have a deeper depth than the first and second body portions.

The third conductive layer may have the same depth as the first and second body portions.

The third conductive layer may have a shallower depth than the first and second body portions.

The first conductive regions may be doped with a P or N type impurity.

The second conductive regions may be doped with an N or P type impurity.

The epitaxial layer may be doped with an N− or P− type impurity.

The power semiconductor device may further include: a semiconductor substrate formed on a bottom surface of the epitaxial layer and doped with an N or P type impurity; and a drain metal layer formed on a bottom surface of the semiconductor substrate and doped with an N or P type impurity.

The power semiconductor device may further include: an insulating layer formed on surfaces of the gate oxide layer and the gate polysilicon layer to expose the first and second conductive regions; and a source metal layer formed on surfaces of the first and second conductive regions exposed by the insulating layer.

The opposite ends of the first conductive layers and the second conductive layers may be respectively aligned along two different imaginary lines.

The gate polysilicon layer may extend on a plane along an S-shaped path between the first windows and the second windows.

Opposite ends of the first windows and the second windows may be alternately arranged with respect to each other and be respectively aligned along two different imaginary lines.

The epitaxial layer may be formed by sequential growth of an N+ type semiconductor and an N− type semiconductor on a P++ type semiconductor substrate.

The epitaxial layer may be formed by sequential growth of a P+ type semiconductor and a P− type semiconductor on an N++ type semiconductor substrate.

According to another aspect of the present invention, there is provided a method of manufacturing a power semiconductor device including: a semiconductor substrate; a conductive low concentration epitaxial layer formed on the semiconductor substrate; first conductive regions, formed in the epitaxial layer, including a plurality of linear first conductive layers spaced from each other by a predetermined distance, a plurality of linear second conductive layers spaced from each other by a predetermined distance, a third conductive layer formed in a space defined between the first conductive layers and the second conductive layers, first body portions formed on both sides of the first conductive layers, and second body portions formed on both sides of the second conductive layers, wherein opposite ends of the first conductive layers and the second conductive layers are alternately arranged with respect to each other and are spaced from each other by a predetermined distance; and second conductive regions formed in the first conductive layers, the second conductive layers, the first body portions, and the second body portions, the method including: implanting a high concentration first impurity into the epitaxial layer using an oxide film pattern as a mask to define regions intended for the first conductive layers, the second conductive layers, and the third conductive layer; sequentially depositing and patterning gate oxide and gate polysilicon on the epitaxial layer and implanting a low concentration first impurity into the epitaxial layer using the gate oxide pattern and the gate polysilicon pattern as masks to define regions intended for the first body portions and second body portions; implanting a high concentration second impurity into the epitaxial layer using the gate oxide pattern and the gate polysilicon pattern as masks to define regions intended for the second conductive regions; and diffusing the first and second impurities to form the first conductive regions and the second conductive regions.

The diffusion of the first and second impurities may be performed so that the third conductive layer is formed to a deeper depth than the first body portions and the second body portions.

The diffusion of the first and second impurities may be performed so that the third conductive layer is formed to the same depth as the first body portions and the second body portions.

The diffusion of the first and second impurities may be performed so that the third conductive layer is formed to a shallower depth than the first body portions and the second body portions.

The method may further include: forming an insulating layer on top and lateral surfaces of the gate polysilicon pattern to expose the first and second conductive regions; forming a source metal layer on surfaces of the first and second conductive regions exposed by the insulating layer; and forming a drain metal layer on a bottom surface of the semiconductor substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1A:
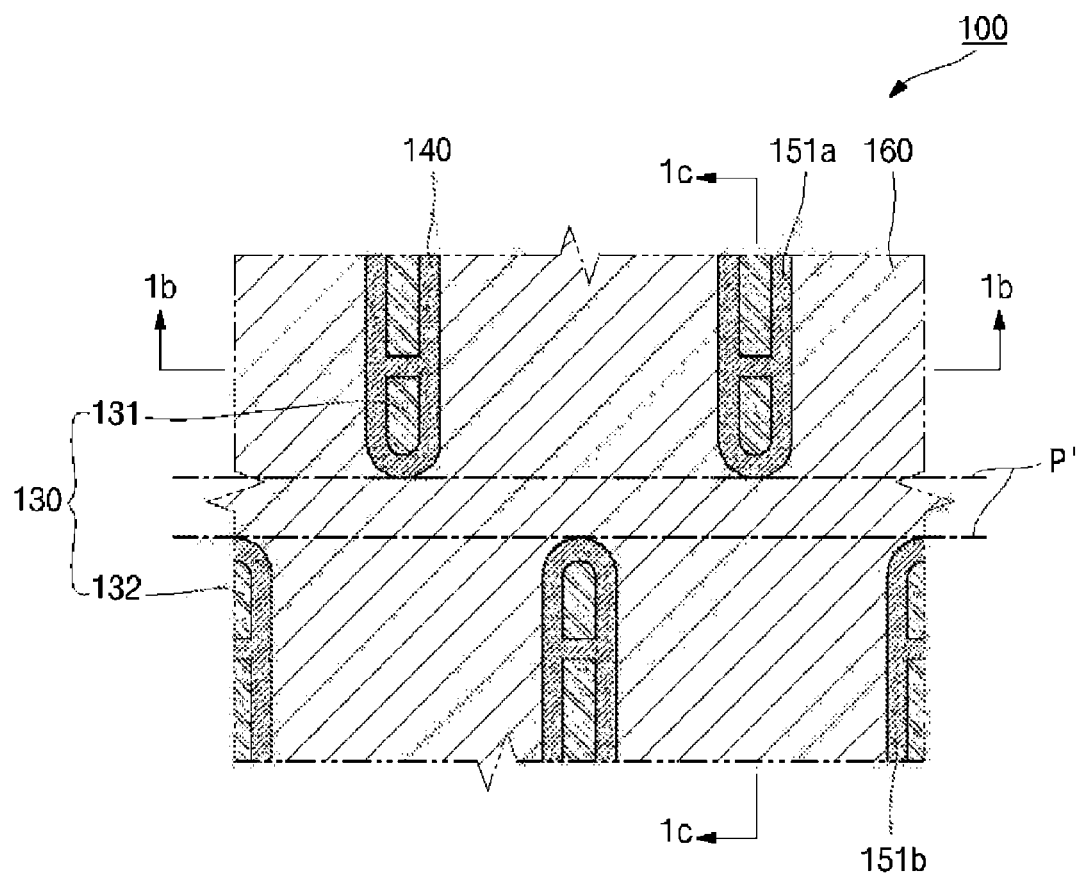
FIG. 1A is a partial top view of a power semiconductor device according to an embodiment of the present invention before forming a source metal layer.
Figure 1B:
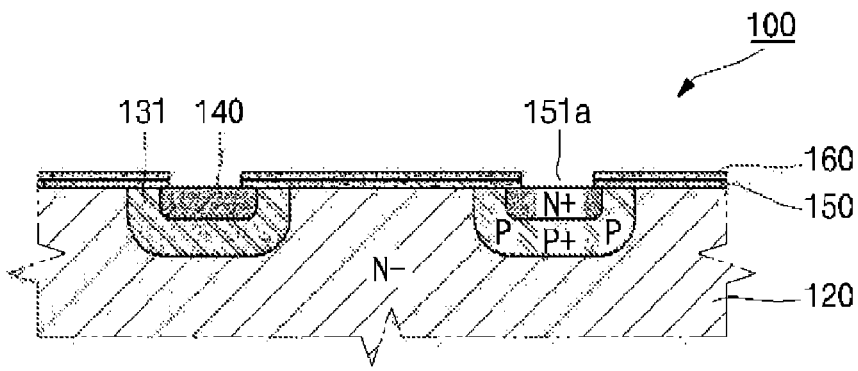
FIG. 1B is a sectional view taken along a line 1b-1b of FIG. 1A.
Figure 1C:
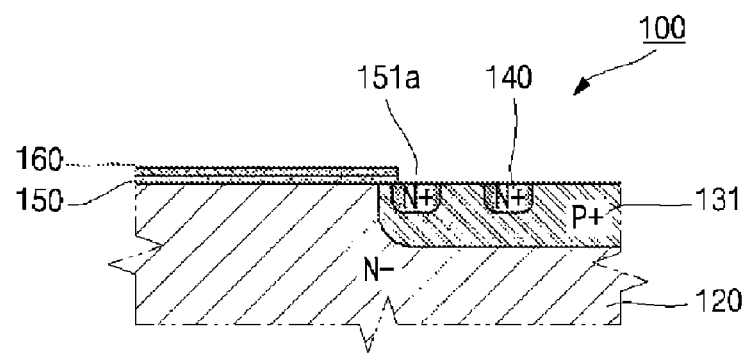
FIG. 1C is a sectional view taken along a line 1c-1c of FIG. 1A.
Figure 1D:
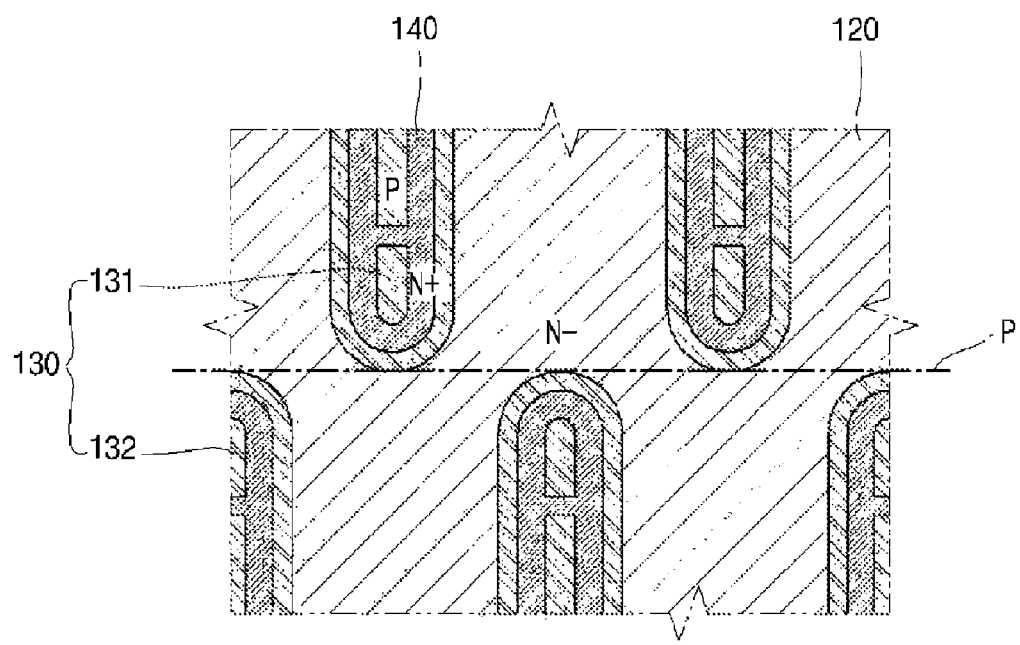
FIG. 1D is a partial top view of the semiconductor device of FIG. 1A where a gate polysilicon layer and a gate oxide layer are omitted.

FIG. 1A is a partial top view of a power semiconductor device according to an embodiment of the present invention before forming a source metal layer, FIG. 1B is a sectional view taken along a line 1b-1b of FIG. 1A, FIG. 1C is a sectional view taken along a line 1c-1c of FIG. 1A, and FIG. 1D is a partial top view of the semiconductor device of FIG. 1A where a gate polysilicon layer and a gate oxide layer are omitted.

Referring to FIGS. 1A through 1D, a power semiconductor device 100 according to an embodiment of the present invention includes an epitaxial layer 120; a plurality of first conductive regions 130 formed in a surface of the epitaxial layer 120 and spaced from each other by a predetermined distance; a plurality of second conductive regions 140 formed in the first conductive regions 130; a gate oxide layer 150 formed on a surface of the epitaxial layer 120 to define windows in the first conductive regions 130; and a gate polysilicon layer 160 formed on the gate oxide layer 150.

The epitaxial layer 120 is formed to a predetermined thickness on a semiconductor substrate (not shown). The semiconductor substrate may be a silicone substrate doped with a high concentration N or P type impurity, and may have a thickness of about 50 to 400 µm. The epitaxial layer 120 may be a silicone layer doped with a low concentration N or P type impurity and may have a thickness of about 3 to 150 µm.

The first conductive regions 130 include first conductive layers 131 and second conductive layers 132 that are formed in a linear shape and spaced from each other by a predetermined distance. In more detail, the first conductive layers 131 and the second conductive layers 132 are alternately arranged with respect to each other with the same pitch. That is, a middle region between two adjacent ones of the first conductive layers 131 (or the second conductive layers 132) is located on a lengthwise extension line of each adjacent one of the second conductive layers 132 (or the first conductive layers 131) (i.e., the lengthwise extension line of each of the second conductive layers 132 is shifted from each adjacent one of the first conductive layers 131 in a direction perpendicular to the extending direction of the first conductive layers 131 by about a half of a pitch between the first conductive layers 131). In other words, two adjacent ones of the second conductive layers 132 are located in oblique directions with respect to the extending direction of each adjacent one of the first conductive layers 131. Further, as shown in FIG. 1D, opposite ends of the first conductive layers 131 and the second conductive layers 132 are alternately arranged with respect to each other so that they are aligned along an imaginary line P. The opposite ends of the first and second conductive layers 131 and 132 may be formed in a semi-circular shape, as viewed in a plane (i.e., as viewed from top as in FIG. 1D), in order to prevent undesired current concentration on any one region when the device 100 is operated. Of course, the first and second conductive layers 131 and 132 may be shaped as an approximately semi-cylinder with an approximately ¼ spherical end.

Figure 3A:
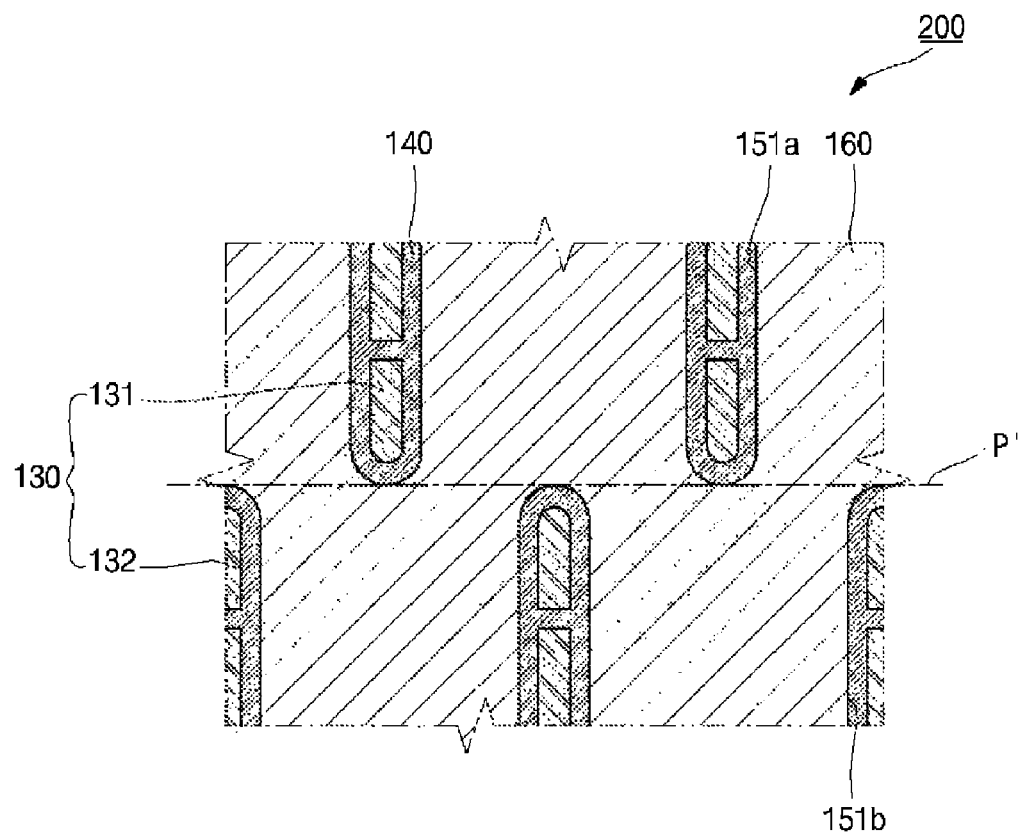
FIG. 3A is a partial top view of a power semiconductor device according to another embodiment of the present invention before forming a source metal layer.
Figure 3B:
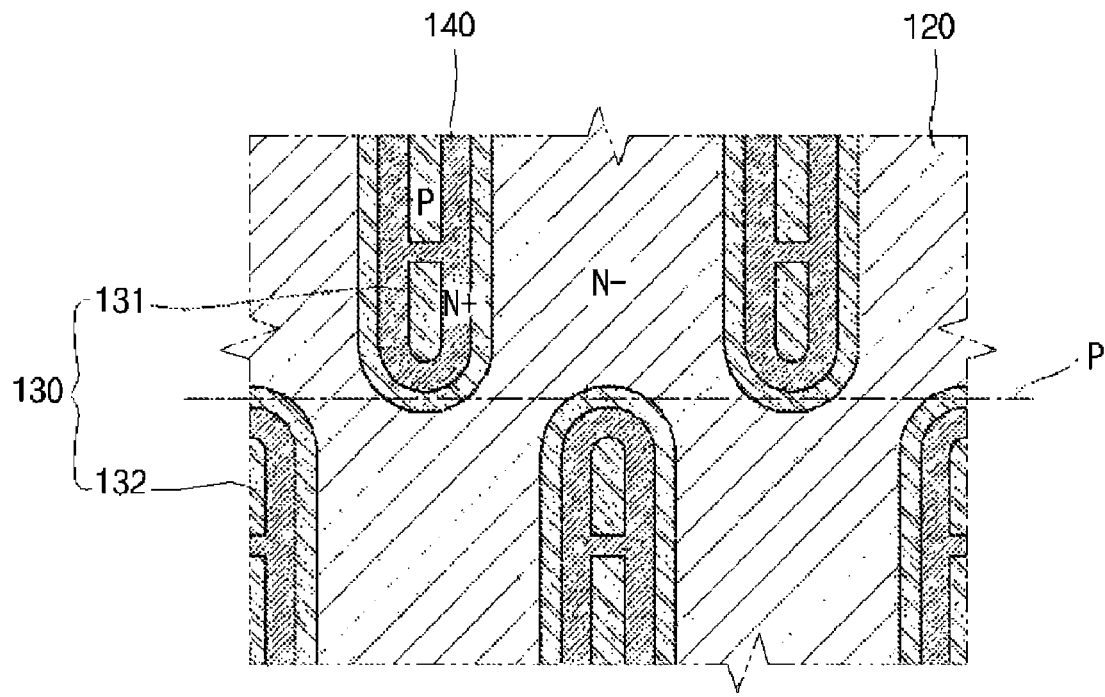
FIG. 3B is a partial top view of the semiconductor device of FIG. 3A where a gate polysilicon layer and a gate oxide layer are omitted.

Although FIG. 1D illustrates that the opposite ends of the first conductive layers 131 and the second conductive layers 132 are aligned along the single common imaginary line P, the opposite ends of the first conductive layers 131 and the second conductive layers 132 may be respectively aligned along two different imaginary lines (not shown) or may be aligned to overlap with each other along a single imaginary line (see P in FIG. 3B).

The first conductive layers 131 and the second conductive layers 132 may be formed to a depth of about 1 to 5 μm using a P or N type impurity, but the present invention is not limited thereto. Center portions of the first and second conductive layers 131 and 132 may be doped with a relatively high concentration impurity, and peripheral portions thereof may be doped with a relatively low concentration impurity.

The second conductive regions 140 may be formed to a predetermined depth in the first and second conductive layers 131 and 132. It should be understood that the width and depth of the second conductive regions 140 are smaller than those of the first and second conductive layers 131 and 132.

The second conductive regions 140 may be formed to a depth of about 1 μm or less using a high concentration N or P type impurity, but the present invention is not limited thereto.

Under such a structure, channels through which carriers (e.g. electrons) pass may be formed along surfaces of the first conductive regions 130 extending outwardly with respect to the second conductive regions 140.

The gate oxide layer 150 is formed on a surface of the epitaxial layer 120 to define first windows 151a having a smaller width than the first conductive layers 131 and second windows 151b having a smaller width than the second conductive layers 132. In more detail, the first windows 151a partially cover the second conductive regions 140 formed in the first conductive layers 131, and the second windows 152b partially cover the second conductive regions 140 formed in the second conductive layers 132. The gate oxide layer 150 may be formed to a thickness of about 200 to 1,000 Å, but the present invention is not limited thereto.

The gate polysilicon layer 160 is formed on the gate oxide layer 150. In more detail, the gate polysilicon layer 160 is formed only on the gate oxide layer 150 so that the second conductive regions 140 are exposed through the first windows 151a and the second windows 151b. The gate polysilicon layer 160 is doped with a conductive impurity (e.g., N or P type impurity) to serve as a gate.

The gate polysilicon layer 160 extends on a plane to form an approximately S-shaped path with respect to the arrangement of the first windows 151a and the second windows 151b. That is, the opposite ends of the first conductive layers 131 and the second conductive layers 132 are aligned along the single common imaginary line P, whereas opposite ends of the first windows 151a and the second windows 151b are respectively aligned along two different imaginary lines P'. In other words, the gate polysilicon layer 160 extends along an approximately S-shaped path between the first windows 151a and the second windows 151b.

Although FIG. 1A illustrates that the opposite ends of the first windows 151a and the second windows 151b are respectively aligned along the two imaginary lines P', the opposite ends of the first windows 151a and the second windows 151b may be aligned along a single imaginary line (see P' in FIG. 3A) or may be aligned to overlap with each other along a single imaginary line (not shown).

FIGS. 1A through 1D illustrate a few of the first conductive regions 130 and the second conductive regions 140. However, it should be understood that several tens to several hundreds of the first and second conductive regions 130 and 140 may be disposed on a single semiconductor die.

According to the present invention, the first conductive regions 130, i.e., the first and second conductive layers 131 and 132 can receive gate signals from all directions (e.g., up-/down-ward/right-/left-ward) on a plane without requiring gate bus lines, unlike a conventional power semiconductor device including gate bus lines connecting vertical gate polysilicons. That is, since the gate polysilicon layer 160 extends on a plane along an approximately S-shaped path between the first and second conductive layers 131 and 132, the first and second conductive layers 131 and 132 can receive gate signals from all directions (e.g., up-/down-ward/right-/left-ward).

Furthermore, since drift regions of the epitaxial layer 120 extending outwardly with respect to the first conductive regions 130 (i.e., the first conductive layers 131 and the second conductive layers 132) have relatively large and uniform areas, an undesired current concentration phenomenon does not occur in an on-state of the device 100. In addition, with respect to the widths of the channels formed in surfaces of the first conductive regions 130 (i.e., the first conductive layers 131 and the second conductive layers 132) extending outwardly with respect to the second conductive regions 140, portions of spherical junctions facing the gate oxide layer 150 have a 1.5 times greater channel width than cylindrical junctions, thereby improving overall drain-source on-resistance ($R_{ds(ON)}$) or collector-emitter saturation voltage ($V_{CE(SAT)}$).

Figure 2:
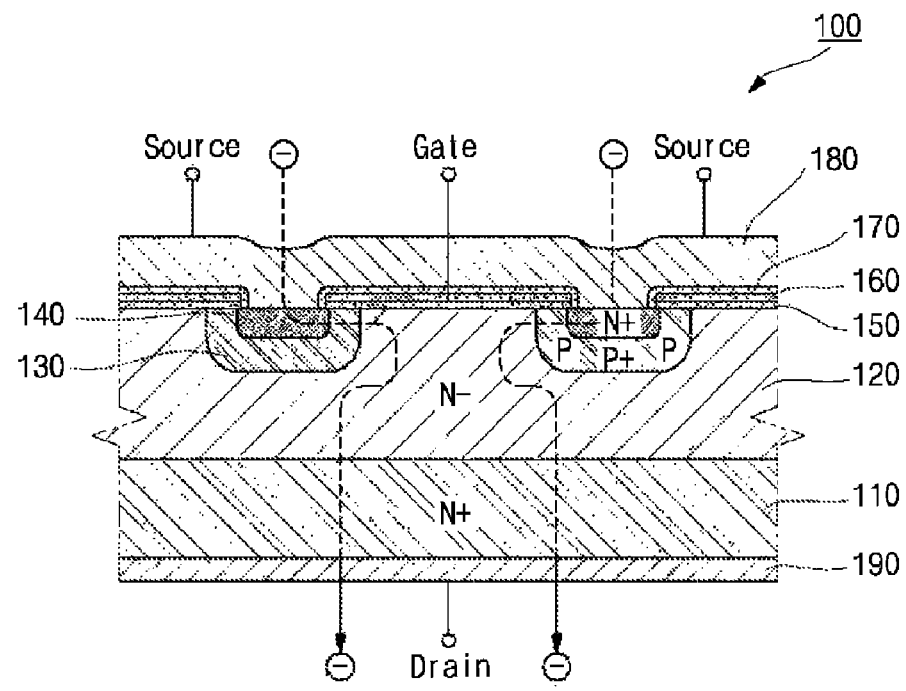
FIG. 2 is a sectional view of the power semiconductor device of FIGS. 1A through 1D having thereon a source metal layer and a drain metal layer.

FIG. 2 is a sectional view of the power semiconductor device 100 of FIGS. 1A through 1D having thereon a source metal layer and a drain metal layer. The operation principle of the power semiconductor device 100 will now be described briefly with reference to FIG. 2.

Referring to FIG. 2, together with FIGS. 1A through 1D, a drain metal layer 190 is formed of aluminum or an equivalent metal thereof on a surface (a bottom surface in FIG. 2) of a semiconductor substrate 110 opposite to the epitaxial layer 120. An insulating layer 170 is formed to a predetermined thickness on the gate polysilicon layer 160 to cover the lateral surfaces of the gate oxide layer 150 and the gate polysilicon layer 160. A source metal layer 180 is formed to a predetermined thickness using aluminum or an equivalent metal thereof on surfaces of the second conductive regions 140 exposed by the insulating layer 170. Of course, the second conductive regions 140 are connected to each other via the source metal layer 180. Although not shown, the gate polysilicon layer 160 is connected to a predetermined region called "gate metal layer".

When predetermined voltages are applied to the gate metal layer (not shown) and between the source metal layer 180 and the drain metal layer 190, a predetermined amount of current flows from the drain metal layer 190 to the source metal layer 180. That is, when a voltage is applied to the gate metal layer, channels are formed in surfaces of the first conductive regions 130 extending outwardly with respect to the second conductive regions 140. Therefore, electrons flow from the source metal layer 180 to the drain metal layer 190 via the second conductive regions 140, the channels formed in the first conductive regions 130, the epitaxial layer 120 (drift regions), and the semiconductor substrate 110.

FIG. 2 illustrates a power semiconductor device including an N+ type semiconductor substrate, an N− type epitaxial layer, a P type first conductive region, and an N type second conductive region, and such a power semiconductor device is referred to as an N type MOSFET. The present invention can also be applied to a P type MOSFET, specifically a power semiconductor device including a P type semiconductor substrate, a P− type epitaxial layer, an N type first conductive region, and a P type second conductive region.

The present invention can also be applied to IGBTs, in addition to MOSFETs.

Figure 4:
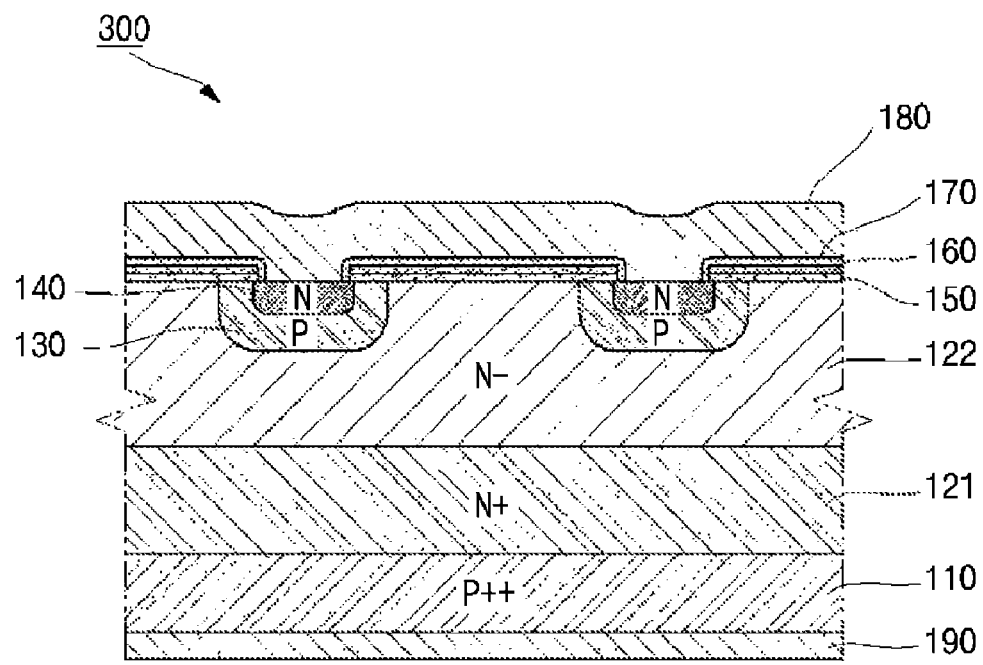
FIG. 4 is a sectional view of a power semiconductor device according to still another embodiment of the present invention.

In detail, the above-described arrangements of first conductive regions and windows can be applied to an N channel IGBT that includes a P++ type semiconductor substrate 110, an N+ type epitaxial layer 121, an N− type epitaxial layer 122, a P type first conductive region 130, and an N type second conductive region 140, as shown in FIG. 4.

Although not shown, the above-described arrangements of first conductive regions and windows can also be applied to a P channel IGBT that includes an N+ type semiconductor substrate, a P+ type epitaxial layer, a P− type epitaxial layer, an N type first conductive region, and a P type second conductive region.

Hereinafter, a method of manufacturing a power semiconductor device according to an embodiment of the present invention will be described with reference with FIGS. 5A through 5D.

FIGS. 5A through 5D are sequential views illustrating a method of manufacturing a power semiconductor device according to an embodiment of the present invention.

Figure 5A:
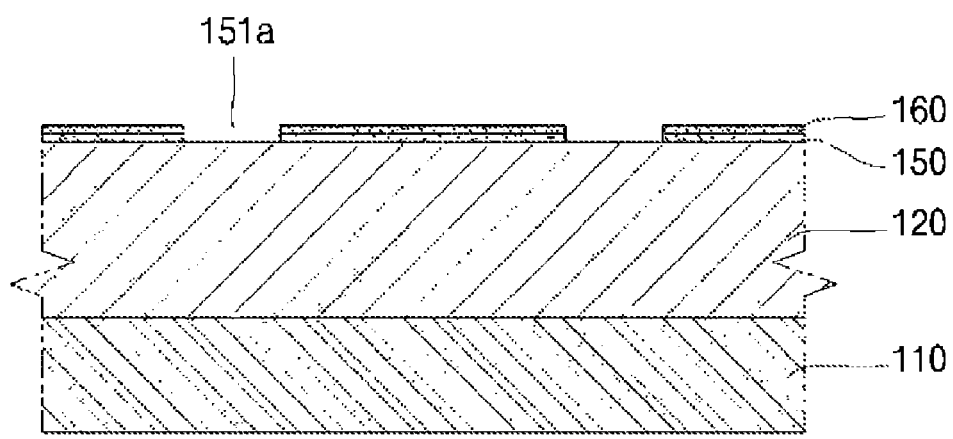
FIGS. 5A through 5D are sequential views illustrating a method of manufacturing a power semiconductor device according to an embodiment of the present invention.

First, referring to FIG. 5A, an epitaxial layer 120 is formed to a predetermined thickness on a semiconductor substrate 110. A gate oxide layer 150 and a gate polysilicon layer 160 are sequentially formed to predetermined thicknesses on the epitaxial layer 120 and etched by photolithography to form a plurality of windows 151*a* of an approximately linear shape, through which the epitaxial layer 120 is exposed. A planar arrangement of the windows 151*a* will be described later.

The semiconductor substrate 110 may be a silicone substrate doped with a high concentration N type impurity, and may be formed to a thickness of about 50 to 400 μm. The epitaxial layer 120 may be a silicone layer doped with a low concentration N type impurity, and may be formed to a thickness of about 3 to 150 μm, but the present invention is not limited thereto.

Figure 5B:
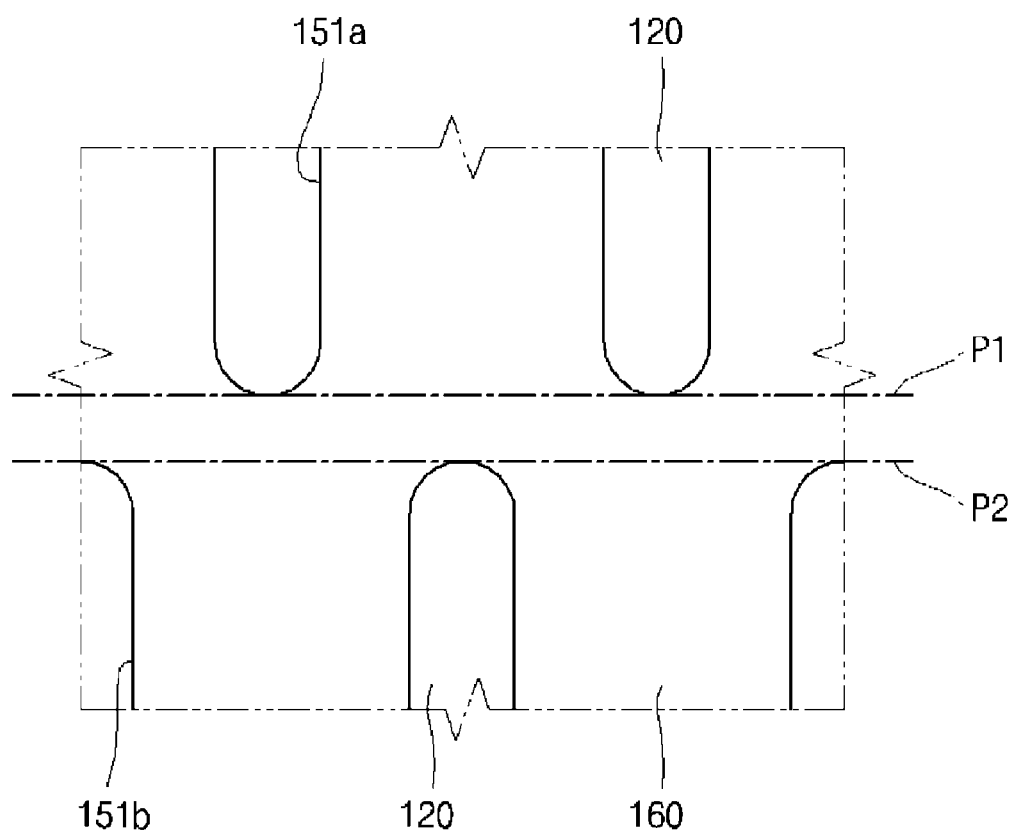

Next, referring to FIG. 5B, together with FIG. 5A, the windows defined by etching of the gate oxide layer 150 and the gate polysilicon layer 160 may be largely divided into first windows 151*a* and second windows 151*b*. A large number of the first and second windows 151*a* and 151*b* may be formed, and opposite ends of the first and second windows 151*a* and 151*b* may be formed in an approximately semi-circular shape, as viewed in a plane (i.e., as viewed from top as in FIG. 5B). The first windows 151*a* and the second windows 151*b* are alternately arranged with respect to each other so that opposite ends of the first windows 151*a* and the second windows 151*b* are aligned along imaginary lines P1 and P2, respectively. The first windows 151*a* and the second windows 151*b* are arranged with substantially the same pitch, and a middle region between two adjacent ones of the first windows 151*a* is located on a lengthwise extension line of each adjacent one of the second windows 151*b*. That is, the lengthwise extension line of each of the second windows 151*b* is shifted from each adjacent one of the first windows 151*a* in a direction perpendicular to the extending direction of the first windows 151*a* by about a half of a pitch between the first windows 151*a*.

Figure 5C:
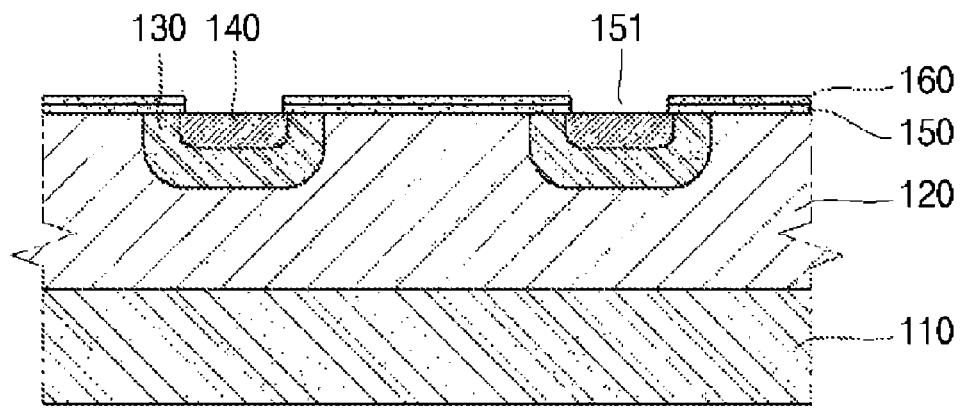

Next, referring to FIG. 5C, together with FIGS. 5A and 5B, first conductive regions 130 and second conductive regions 140 are sequentially formed to predetermined depths in portions of the epitaxial layer 120 exposed through the windows 151. For example, the first conductive regions 130 may be formed by implanting a P type impurity (e.g., boron (B)) through the windows 151 using a self-alignment technique followed by annealing at about 1100 L or more. A P type impurity may be further implanted into center portions of the first conductive regions 130 using a mask to provide an ohmic contact between the first conductive regions 130 and a source metal layer as will be described later. The second conductive regions 140 may be formed by implanting an N type impurity (e.g., arsenic (As)) followed by annealing at about 900 L or more. At this time, the first conductive regions 130 and the second conductive regions 140 may be formed to depths of about 1 to 5 μm and about 1 μm or less, respectively.

Figure 5D:
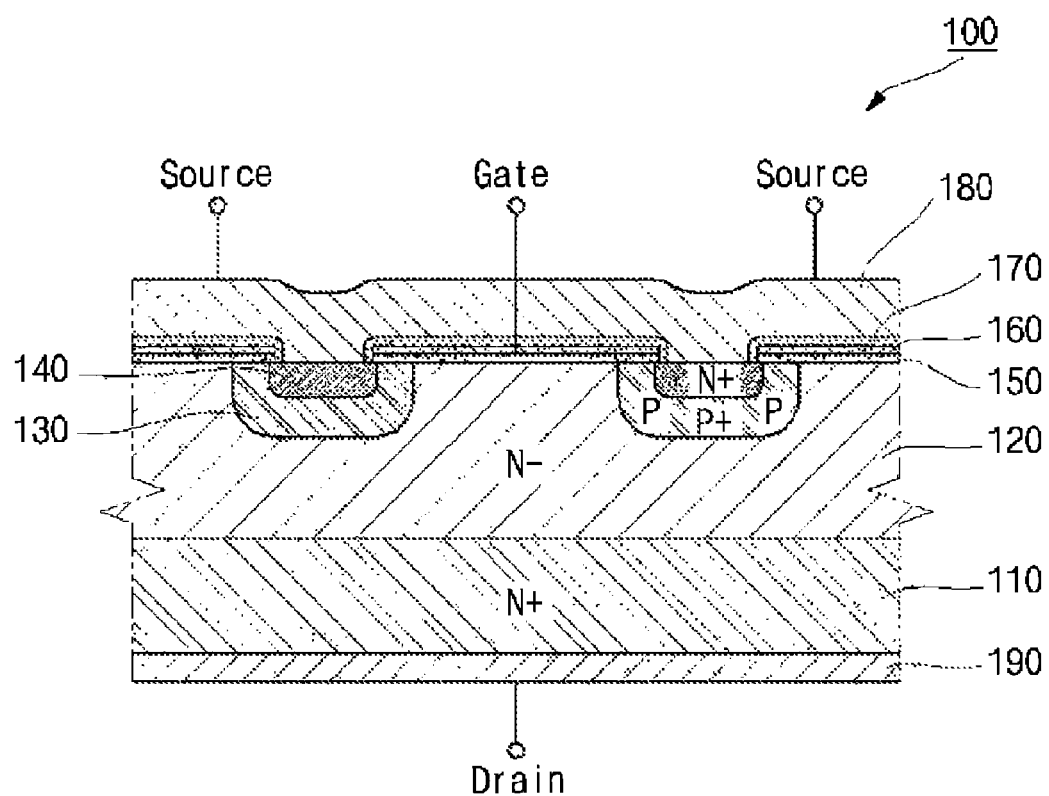

Next, referring to FIG. 5D, together with FIGS. 5A through 5C, an insulating layer formation process, an etching process, and a metal deposition process are performed. That is, an insulating layer 170 is formed to a predetermined thickness on top and laterial surfaces of the gate polysilicon layer 160 and a lateral surface of the gate oxide layer 150, and a source metal layer 180 is formed on surfaces of the second conductive regions 140 exposed by the insulating layer 170 using aluminum or an equivalent thereof. A drain metal layer 190 is formed on the bottom surface of the semiconductor substrate 110 using a metal such as vanadium. This completes a power semiconductor device 100.

Although not shown, in order to apply a voltage to the gate polysilicon layer 160, a gate metal layer is formed in a predetermined region (called "gate pad") of the power semiconductor device 100 using aluminum or an equivalent thereof. The power semiconductor device 100 thus manufactured is mounted on a lead frame or the like, followed by wire-bonding and molding to thereby complete a semiconductor package. Here, the drain metal layer 190 is directly connected to a die paddle of the lead frame through soldering, and the source metal layer 180 and the gate metal layer are wire-bonded to a lead of the lead frame.

Figure 6A:
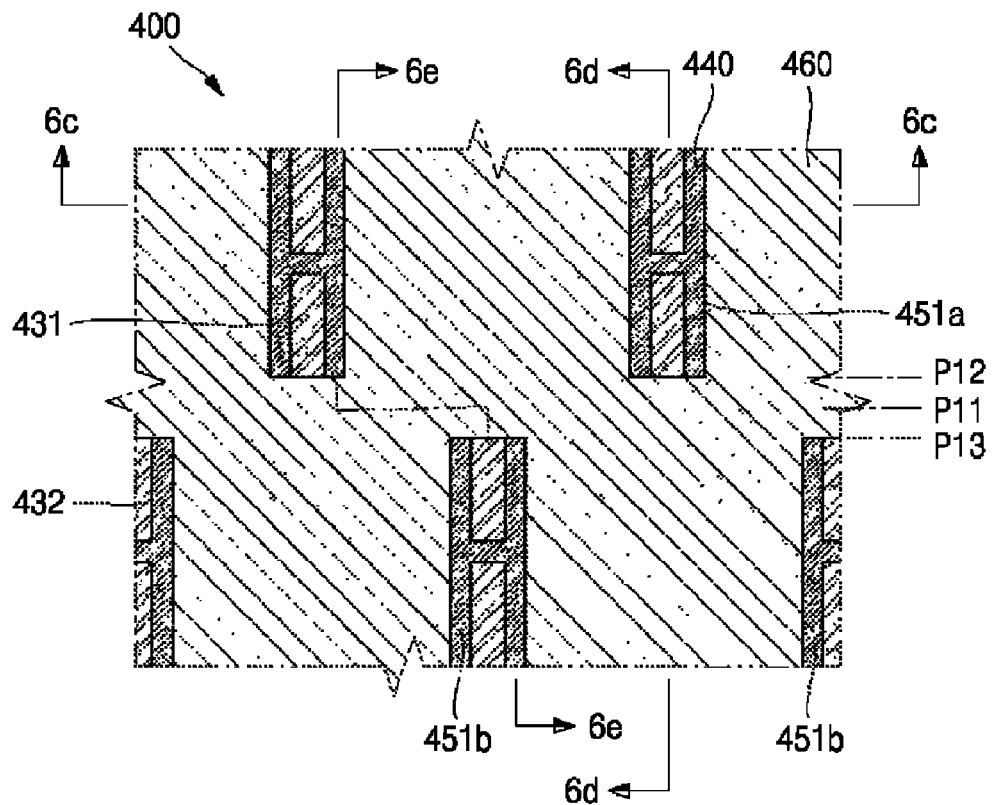
FIG. 6A is a partial top view of a power semiconductor device according to still another embodiment of the present invention before forming a source metal layer.
Figure 6B:
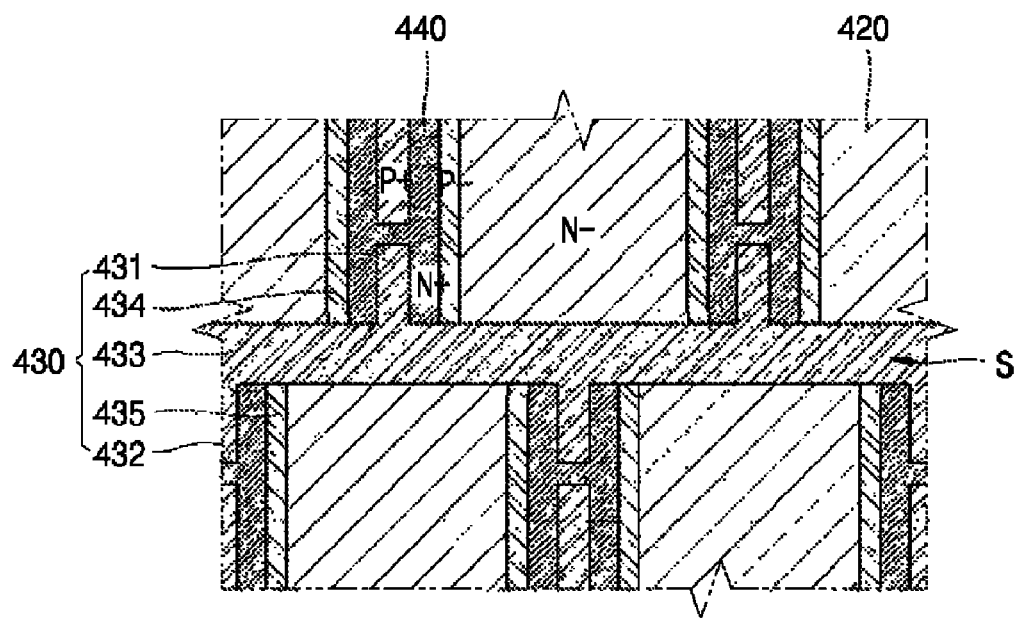
FIG. 6B is a partial top view of the semiconductor device of FIG. 6A where a gate polysilicon layer and a gate oxide layer are omitted.
Figure 6C:
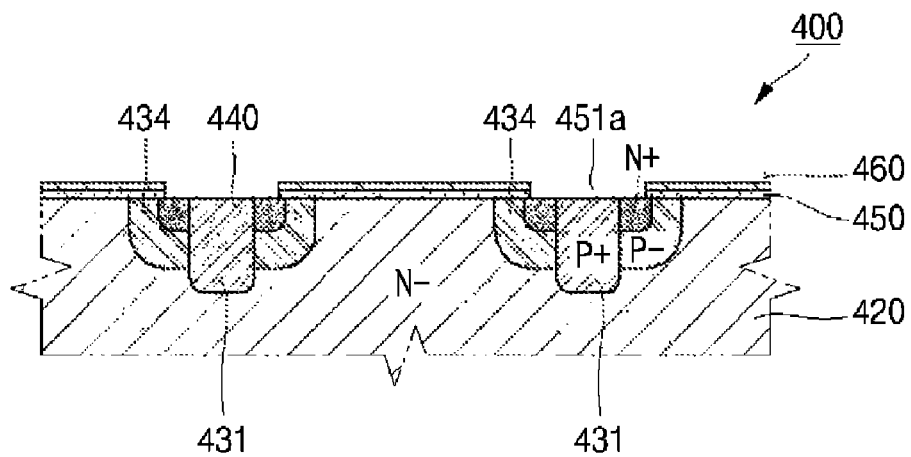
FIG. 6C is a sectional view taken along a line 6c-6c of FIG. 6A.
Figure 6D:
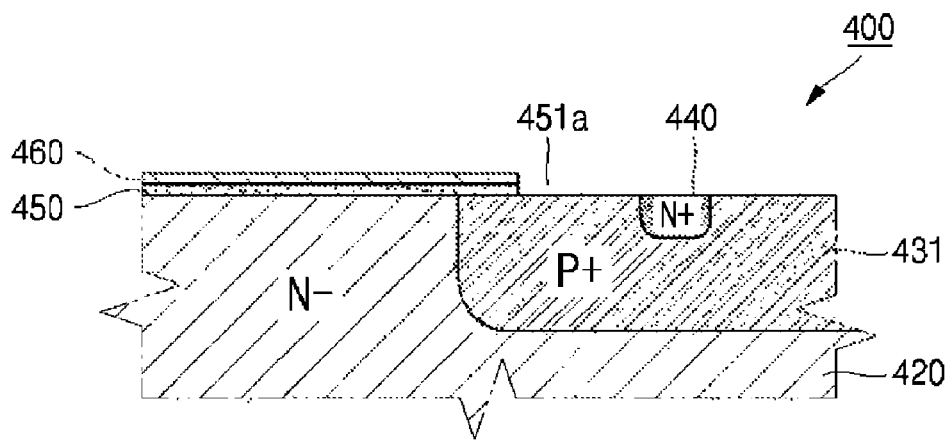
FIG. 6D is a sectional view taken along a line 6d-6d of FIG. 6A.
Figure 6E:
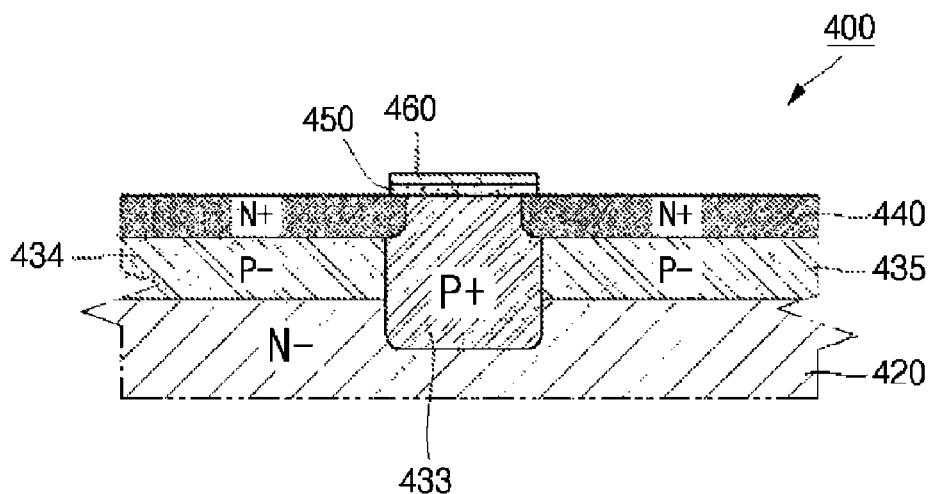
FIG. 6E is a sectional view taken along a line 6e-6e of FIG. 6A.

FIG. 6A is a partial top view of a power semiconductor device according to still another embodiment of the present invention before forming a source metal layer, FIG. 6B is a partial top view of the semiconductor device of FIG. 6A where a gate polysilicon layer and a gate oxide layer are omitted, FIG. 6C is a sectional view taken along a line 6*c*-6*c* of FIG. 6A, FIG. 6D is a sectional view taken along a line 6*d*-6*d* of FIG. 6A, and FIG. 6E is a sectional view taken along a line 6*e*-6*e* of FIG. 6A.

Referring to FIGS. 6A through 6E, a power semiconductor device 400 according to still another embodiment of the present invention includes an epitaxial layer 420; a plurality of first conductive regions 430 formed in a surface of the epitaxial layer 420 and spaced from each other by a predetermined distance; a plurality of second conductive regions 440 formed in the first conductive regions 430; a gate oxide layer 450 formed on the epitaxial layer 420 to define windows in the first conductive regions 430; and a gate polysilicon layer 460 formed on the gate oxide layer 450.

The epitaxial layer 420 is formed to a predetermined thickness on a semiconductor substrate (not shown). The epitaxial layer 420 is the same as the above-described epitaxial layer 120, and thus, a description thereof will be omitted.

The first conductive regions 430 include first and second conductive layers 431 and 432 formed as a linear shape in a surface of the epitaxial layer 420 and spaced from each other by a predetermined distance; and a third conductive layer 433 connecting the first conductive layers 431 and the second conductive layers 432. The first conductive regions 430 may further include first body portions 434 formed on both sides of the first conductive layers 431; and second body portions 435 formed on both sides of the second conductive layers 432.

In more detail, the first conductive layers 431 and the second conductive layers 432 are alternately arranged with respect to each other with the same pitch. That is, a middle region between two adjacent ones of the first conductive layers 431 (or the second conductive layers 432) is located on the lengthwise extension line of each adjacent one of the second conductive layers 432 (or the first conductive layers 431) (i.e., the lengthwise extension line of each of the second conductive layers 432 is shifted from each adjacent one of the first conductive layers 431 in a direction perpendicular to the extending direction of the first conductive layers 431 by about a half of a pitch between the first conductive layers 431). In other words, two adjacent ones of the second conductive layers 432 are located in oblique directions with respect to the extending direction of each adjacent one of the first conductive layers 431. Opposite ends of the first conductive layers 431 and the second conductive layers 432 are alternately arranged with respect to each other so that they are spaced from each other by a predetermined distance on the basis of an imaginary line P11. The first and second conductive layers 431 and 432 are formed in an approximately semi-cylindrical shape.

The first and second conductive layers 431 and 432 may be formed to a depth of about 1 to 5 μm using a P or N type impurity, but the present invention is not limited thereto. The first and second conductive layers 431 and 432 may be doped with a high concentration impurity.

The third conductive layer 433 is formed in a space S defined between the opposite ends of the first conductive layers 431 and the second conductive layers 432. The third conductive layer 433 is perpendicular to the first and second conductive layers 431 and 432. The third conductive layer 433 is doped with the same high concentration impurity as the first and second conductive layers 431 and 432, and is responsible for electrical connection between the first conductive layers 431 and the second conductive layers 432. As such, since the first and second conductive layers 431 and 432 are connected by the third conductive layer 433, a cylinder surface junction, instead of a sphere surface junction, is formed between the epitaxial layer 420 and each of the first and second conductive layers 431 and 432, thereby preventing the lowering of the break-down voltage in an active region, unlike a case where an epitaxial layer and a first conductive region have a sphere surface junction where electric field concentration easily occurs, thereby causing the lowering of the break-down voltage in an active region.

The first body portions 434 are disposed on both sides of the extending direction of the first conductive layers 431, and the second body portions 435 are disposed on both sides of the extending direction of the second conductive layers 432. The first and second body portions 434 and 435 may be doped with the P or N type impurity as the first and second conductive layers 431 and 432. The first and second body portions 434 and 435 may be doped with the same impurity. The first and second body portions 434 and 435 may be doped with a low concentration impurity. As shown in FIG. 6E, the first, second and third conductive layers 431, 432 and 433 may be formed to a deeper depth than the first and second body portions 434 and 435. Therefore, if there is a sufficiently low drain-source on-resistance ($R_{ds(ON)}$) it is possible to increase the break-down voltage of the power semiconductor device 400 and prevent the undesired operation of a parasitic bipolar transistor due to excessive voltage increase caused by resistance increase in the first body portions 434 or the second body portions 435 below source regions. As such, the power semiconductor device 400 including the third conductive layer 433 as shown in FIG. 6E is suitable to satisfy desired break-down voltage requirements.

The second conductive regions 440 are formed to a predetermined depth in the first and second conductive layers 431 and 432. It should be understood that the width and depth of the second conductive regions 440 are smaller than those of the first and second conductive layers 431 and 432. The second conductive regions 440 may be formed to a depth of about 1 μm or less using a high concentration N or P type impurity, but the present invention is not limited thereto. Under such a structure, channels through which carriers (e.g. electrons) pass may be formed along surfaces of the first conductive regions 430 extending outwardly with respect to the second conductive regions 440.

The gate oxide layer 450 is formed on a surface of the epitaxial layer 420 to define first windows 451a having a smaller width than the first conductive layers 431 and second windows 451b having a smaller width than the second conductive layers 432. In more detail, the first windows 451a partially cover the second conductive regions 440 formed inside the first conductive layers 431, and the second windows 451b partially cover the second conductive regions 440 formed inside the second conductive layers 432. The gate oxide layer 450 may be formed to a thickness of about 200 to 1000 Å, but the present invention is not limited thereto.

The gate polysilicon layer 460 is formed on the gate oxide layer 450. In more detail, the gate polysilicon layer 460 is formed only on the gate oxide layer 450 so that the second conductive regions 440 are exposed through the first windows 451a and the second windows 451b. The gate polysilicon layer 460 is doped with a conductive impurity (e.g., an N or P type impurity) to serve as a gate.

Meanwhile, the gate polysilicon layer 460 extends on a plane to form an approximately S-shaped path with respect to the arrangement of the first windows 451a and the second windows 451b. That is, the opposite ends of the first windows 451a and the second windows 451b are respectively aligned along two different imaginary lines P12 and P13. In other words, the gate polysilicon layer 460 extends along an approximately S-shaped path between the first windows 451a and the second windows 451b.

Although FIG. 6A illustrates that the opposite ends of the first windows 451a and the second windows 451b are aligned along the two different imaginary lines P12 and P13, the opposite ends of the first windows 451a and the second windows 451b may also be aligned along a single common imaginary line P11.

FIGS. 6A through 6E illustrate a few of the first conductive regions 430 and the second conductive regions 440. However, it should be understood that several tens to several hundreds of the first and second conductive regions 430 and 440 may be disposed on a single semiconductor die.

As described above, according to the power semiconductor device 400 of the current embodiment of the present invention, the first conductive layers 431 and the second conductive layers 432 are connected by the third conductive layer 433, and thus, it is possible to produce a cylinder surface junction between the first conductive regions 430 and the epitaxial layer 420, thereby preventing the lowering of the break-down voltage in an active region, unlike a case where an epitaxial layer and a first conductive region have a sphere surface junction where electric field concentration easily occurs, thereby causing the lowering of the break-down voltage in an active region.

Furthermore, it is not necessary to modify the thickness and specific resistance of the epitaxial layer 420 in order to increase the break-down voltage of the device 400, thereby ensuring a sufficiently low drain-source on-resistance ($R_{ds(ON)}$).

Still furthermore, the first conductive regions 430, i.e., the first and second conductive layers 431 and 432 can receive gate signals from all directions (e.g., up-/down-ward/right-/left-ward) on a plane without requiring gate bus lines, unlike a conventional power semiconductor device including gate bus lines connecting vertical gate polysilicons. That is, since the gate polysilicon layer 460 extends on a plane along an approximately S-shaped path between the first and second conductive layers 431 and 432, the first and second conductive layers 431 and 432 can receive gate signals from all directions (e.g., up-/down-ward/right-/left-ward).

In addition, since drift regions of the epitaxial layer 420 extending outwardly with respect to the first conductive regions 430 (i.e., the first conductive layers 431 or the second conductive layers 432) have relatively large and uniform areas, an undesired current concentration phenomenon does not occur in an on-state of the device 400.

Figure 7:
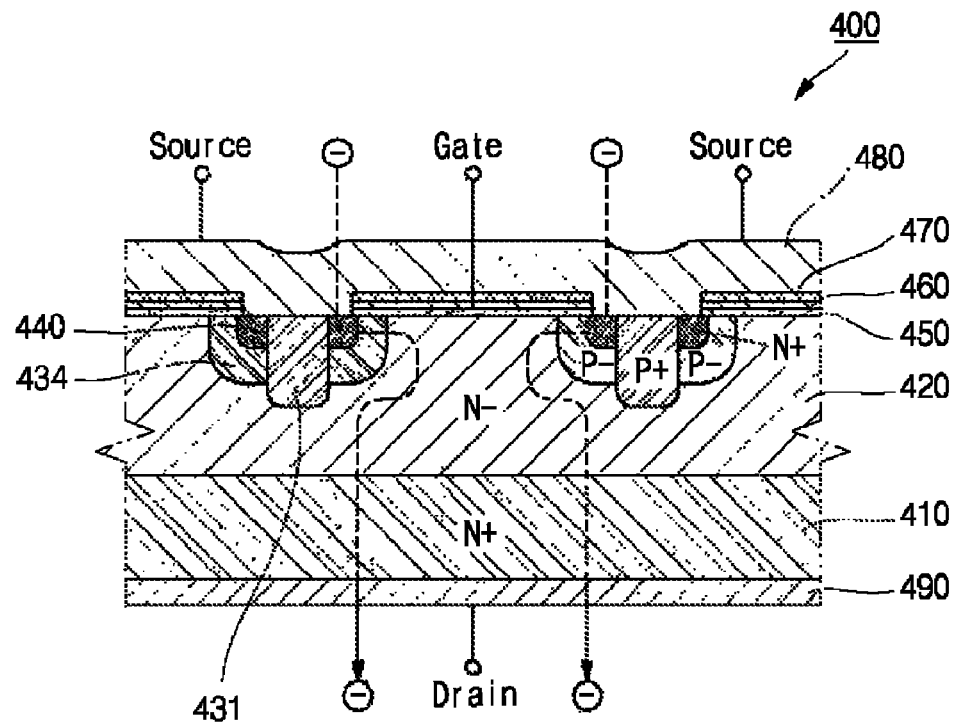
FIG. 7 is a sectional view of the power semiconductor device of FIGS. 6A through 6E having thereon a source metal layer and a drain metal layer.

FIG. 7 is a sectional view of the power semiconductor device 400 of FIGS. 6A through 6E having thereon a source metal layer and a drain metal layer, and the operation principle of the power semiconductor device 400 will now be described briefly with reference to FIG. 7.

Referring to FIG. 7, together with FIGS. 6A through 6E, a drain metal layer 490 is formed of aluminum or an equivalent metal thereof on a surface (a bottom surface in FIG. 7) of a semiconductor substrate 410 opposite to the epitaxial layer 420. An insulating layer 470 is formed to a predetermined thickness on the gate polysilicon layer 460 to cover lateral surfaces of the gate oxide layer 450 and the gate polysilicon layer 460. A source metal layer 480 is formed to a predetermined thickness using aluminum or an equivalent metal thereof on surfaces of the second conductive regions 440 exposed by the insulating layer 470. Of course, the second conductive regions 440 are connected to each other via the source metal layer 480. Although not shown, the gate polysilicon layer 460 is connected to a predetermined region called "gate metal layer".

When predetermined voltages are applied to the gate metal layer (not shown) and between the source metal layer 480 and the drain metal layer 490, a predetermined amount of current flows from the drain metal layer 490 to the source metal layer 480. That is, when a voltage is applied to the gate metal layer, channels are formed in surfaces of the first conductive regions 430 extending outwardly with respect to the second conductive regions 440. Therefore, electrons flow from the source metal layer 480 to the drain metal layer 490 via the second conductive regions 440, the channels formed in the first conductive regions 430, the epitaxial layer 420 (drift regions), and the semiconductor substrate 410.

FIG. 7 illustrates a power semiconductor device including an N+ type semiconductor substrate, an N– type epitaxial layer, a P type first conductive region, and an N type second conductive region, and such a power semiconductor device is referred to as an N type MOSFET. The present invention can also be applied to a P type MOSFET, specifically a power semiconductor device including a P type semiconductor substrate, a P– type epitaxial layer, an N type first conductive region, and a P type second conductive region.

The present invention can also be applied to IGBTs, in addition to MOSFETs.

Figure 8:
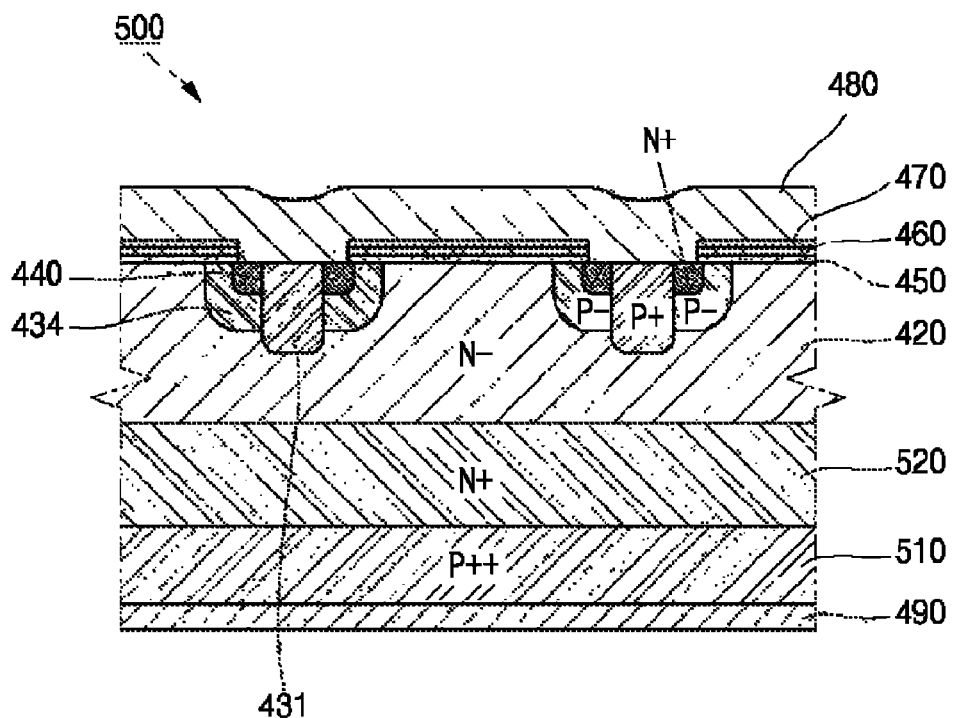
FIG. 8 is a sectional view of a power semiconductor device according to still another embodiment of the present invention.

In detail, the above-described arrangements of first conductive regions and windows can be applied to an N channel IGBT that includes a P++ type semiconductor substrate 510, an N+ type epitaxial layer 520, an N– type epitaxial layer 420, P type first conductive regions 431 and 434, and an N type second conductive region 440, as shown in FIG. 8.

Although not shown, the above-described arrangements of first conductive regions and windows can also be applied to a P channel IGBT that includes an N+ type semiconductor substrate, a P+ type epitaxial layer, a P– type epitaxial layer, an N type first conductive region, and a P type second conductive region.

Figure 9:
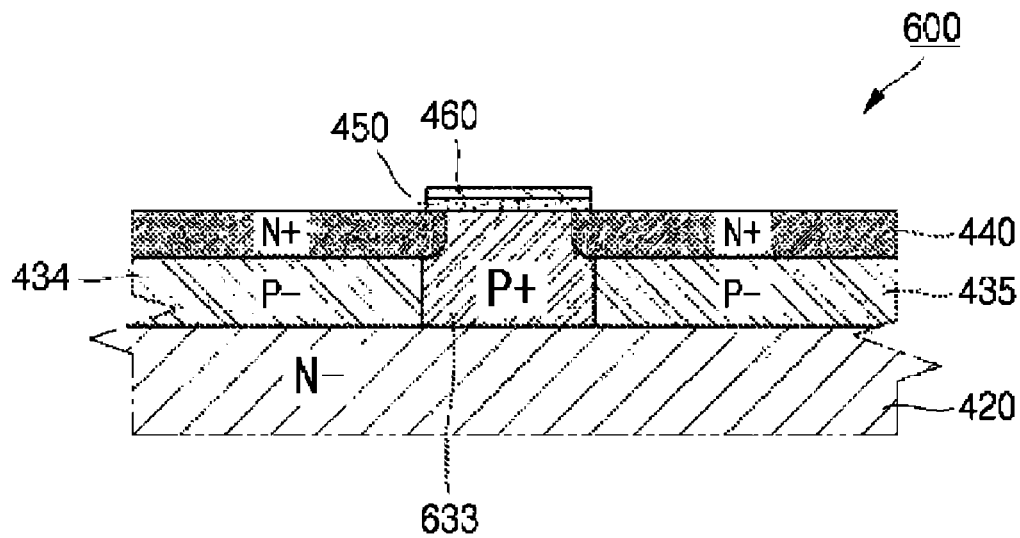
FIG. 9 is a sectional view of a power semiconductor device according to yet another embodiment of the present invention, corresponding to the structure of FIG. 6E.

FIG. 9 is a sectional view of a power semiconductor device according to yet another embodiment of the present invention, corresponding to the structure of FIG. 6E.

Referring to FIG. 9, a power semiconductor device 600 is substantially the same as the power semiconductor device 400 shown in FIG. 6E except that a third conductive layer 633 is formed to the same depth as a first body portion 434 and a second body portion 435. Thus, a detailed description about the power semiconductor device 600 will be omitted herein.

As shown in FIG. 6E, the third conductive layer 433 (or the first and second conductive layers (not shown)) doped with a high concentration P+ type impurity increases the concentration of the low concentration P– type first and second body portions 434 and 435, which is not suitable for satisfying a low threshold voltage requirement and realizing the high integration of unit cells by scaling-down. However, as shown in FIG. 9, the high concentration P+ type third conductive layer 633 is formed to the same depth as the low concentration P– first and second body portions 434 and 435, and thus, it is possible to reduce the elevation of the concentration of the first and second body portions 434 and 435 through diffusion. Therefore, the power semiconductor device 600 shown in FIG. 9 is suitable for satisfying a low threshold voltage requirement and realizing the high integration of unit cells by scaling-down.

Figure 10:
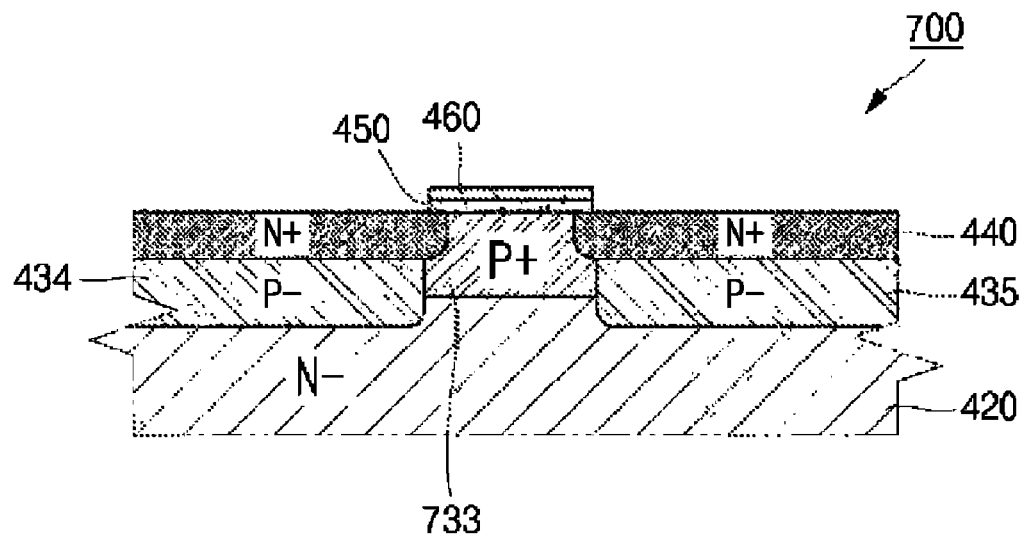
FIG. 10 is a sectional view of a power semiconductor device according to a further embodiment of the present invention, corresponding to the structure of FIG. 6E.

FIG. 10 is a sectional view of a power semiconductor device according to a further embodiment of the present invention, corresponding to the structure of FIG. 6E.

Referring to FIG. 10, a power semiconductor device 700 is substantially the same as the power semiconductor device 400 shown in FIG. 6E except that a third conductive layer 733 is formed to a shallower depth than first and second body portions 434 and 435. Thus, a detailed description about the power semiconductor device 700 will be omitted herein.

According to the power semiconductor device 700 shown in FIG. 10, the third conductive layer 733 (or first and second conductive layers (not shown)) doped with a high concentration P+ impurity is formed to a shallower depth than the first and second body portions 434 and 435 doped with a low concentration P– impurity. Therefore, the power semiconductor device 700 is suitable for satisfying a higher degree of cell integration, a high break-down voltage, and low drain-source on-resistance ($R_{ds(ON)}$).

Hereinafter, a method of manufacturing the power semiconductor device 400 shown in FIGS. 6A through 7 will be described in detail.

Figure 11:
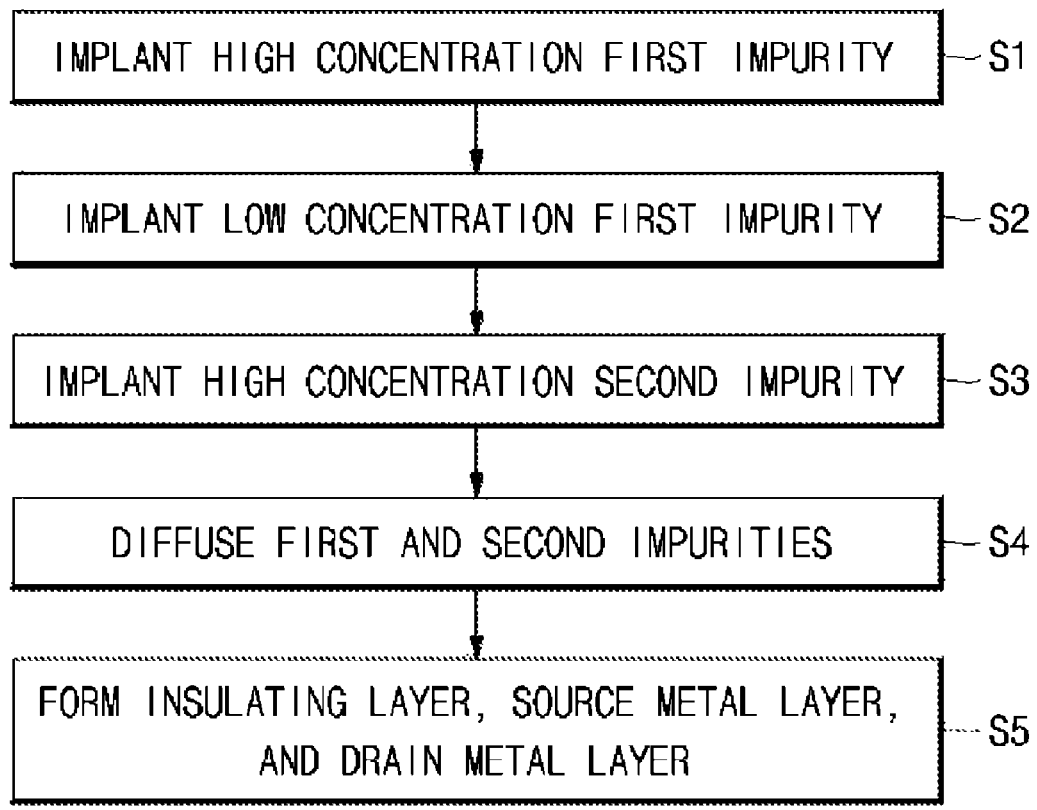
FIG. 11 is a flowchart illustrating a method of manufacturing a power semiconductor device shown in FIGS. 6A through 7.

FIG. 11 is a flowchart illustrating a method of manufacturing the power semiconductor device 400 shown in FIGS. 6A through 7.

Referring to FIG. 11, the manufacturing method for the power semiconductor device 400 includes implantation of a high concentration first impurity (S1); implantation of a low concentration first impurity (S2); implantation of a high concentration second impurity (S3), and diffusion of the first and second impurities (S4). The manufacturing method may further include insulating layer formation and metal deposition (S5).

FIGS. 12A through 12E are sequential sectional views illustrating a method of manufacturing the power semiconductor device 400 shown in FIGS. 6A through 7.

Figure 12A:
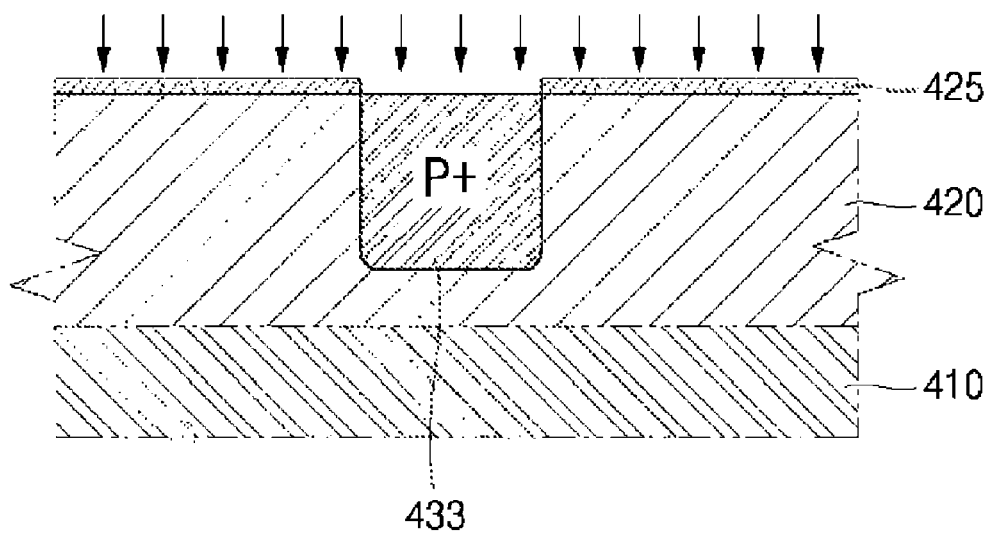
FIGS. 12A through 12E are sequential sectional views illustrating a method of manufacturing a power semiconductor device shown in FIGS. 6A through 7.

Referring FIG. 12A, together with step S1 of FIG. 11, an epitaxial layer 420 is formed to a predetermined thickness on a semiconductor substrate 410. The semiconductor substrate 410 may be a silicone substrate doped with a high concentration N or P type impurity, and may be formed to a thickness of about 50 to 400 µm. The epitaxial layer 420 may be a silicone layer doped with a conductive low concentration N or P type impurity, and may be formed to a thickness of about 3 to 150 µm.

Then, a high concentration first impurity is implanted into the epitaxial layer 420 using an oxide film pattern 425 as a mask to define regions intended for a plurality of linear first and second conductive layers 431 and 432 spaced from each other by a predetermined distance, and a third conductive layer 433 extending in a space S defined between the opposite ends of the first conductive layers 431 and the second conductive layers 432, as shown in FIGS. 6A through 6E. At this time, the implantation of the high concentration first impurity is performed so that opposite ends of the first conductive layers 431 and the second conductive layers 432 are alternately arranged with respect to each other. The high concentration first impurity may be a high concentration N or P type impurity. In FIG. 12A, an arrow represents the implantation of a P+ impurity. Here, the P+ impurity may be boron (B).

Figure 12B:
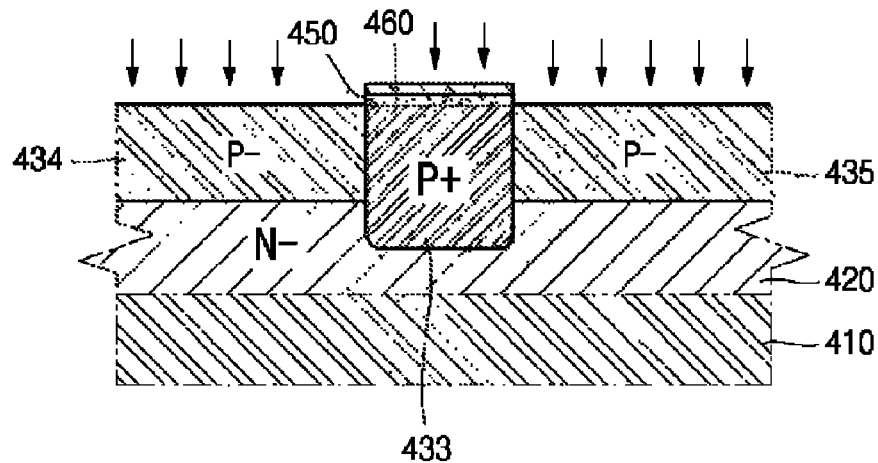

Next, referring to FIG. 12B, together with FIG. 12A and step S2 of FIG. 11, gate oxide and gate polysilicon are sequentially deposited on the epitaxial layer 420 and patterned to form a gate oxide layer 450 and a gate polysilicon layer 460, and a low concentration first impurity is implanted into the epitaxial layer 420 using the gate oxide layer 450 and the gate polysilicon layer 460 as masks to define regions intended for first body portions 434 on both sides of the extending direction of the first conductive layers 431 and second body portions 435 on both sides of the extending direction of the second conductive layers 432. The low concentration first impurity may be a low concentration N or P type impurity. In FIG. 12B, an arrow represents the implantation of a P− impurity. Here, the P− impurity may be boron (B).

Figure 12C:
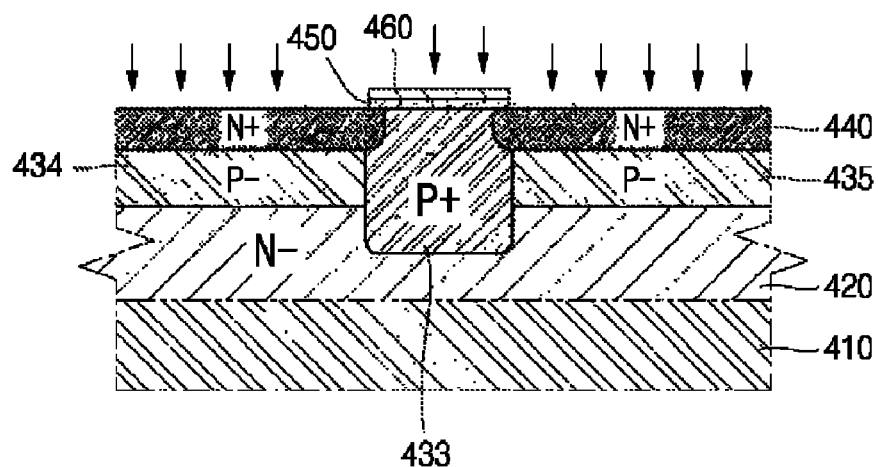

Next, referring to FIG. 12C, together with FIGS. 12A and 12B and step S3 of FIG. 11, a high concentration second impurity is implanted into the first conductive layers 431, the second conductive layers 432, the first body portions 434, and the second body portions 435 using the gate oxide layer 450 and the gate polysilicon layer 460 as masks to define regions intended for second conductive regions 440 in the first conductive layers 431, the second conductive layers 432, the first body portions 434, and the second body portions 435. The second impurity may be a high concentration N or P type impurity. In FIG. 12C, an arrow represents the implantation of an N+ impurity. Here, the N+ impurity may be arsenic (As).

Figure 12D:
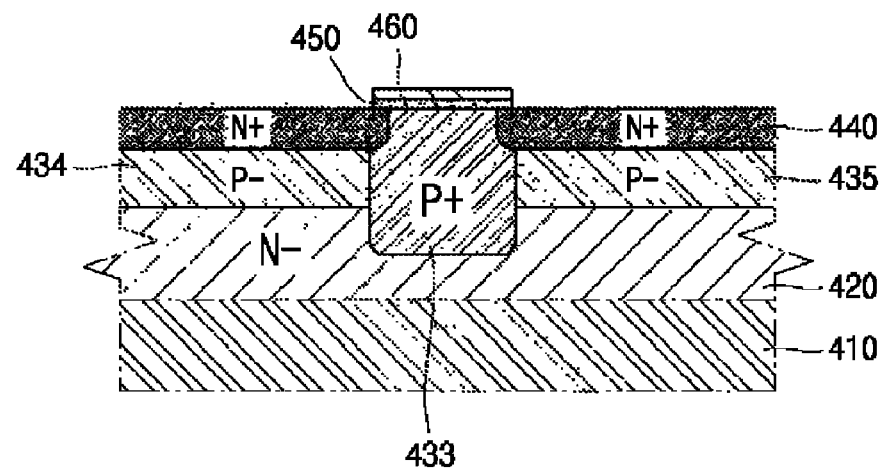

Next, referring to FIG. 12D, together with FIGS. 12A through 12C and step S4 of FIG. 11, the first and second impurities are diffused to form the first conductive regions 430 (i.e., the first conductive layers 431, the second conductive layers 432, the third conductive layer 433, the first body portions 434, the second body portions 434) and the second conductive regions 440. The diffusion of the first and second impurities may be performed by annealing.

In more detail, the diffusion may be performed so that the third conductive layer 433 is formed to a deeper depth than the first and second body portions 434 and 435. For this, the doping amount and implantation energy of the P+ impurity may be set to be higher than those of the P− impurity, or the diffusion may be performed for a longer time at high temperature.

Alternatively, as shown in FIG. 9, the diffusion may be performed so that the third conductive layer 633 is formed to the same depth as the first and second body portions 434 and 435. For this, the doping amount and implantation energy of the P+ impurity may be set to be the same as those of the P− impurity.

Alternatively, as shown in FIG. 10, the diffusion may be performed so that the third conductive layer 733 is formed to a shallower depth than the first and second body portions 434 and 435. For this, the doping amount and implantation energy of the P− impurity may be set to be higher than those of the P+ impurity, or the diffusion may be performed for a shorter time at low temperature.

Figure 12E:
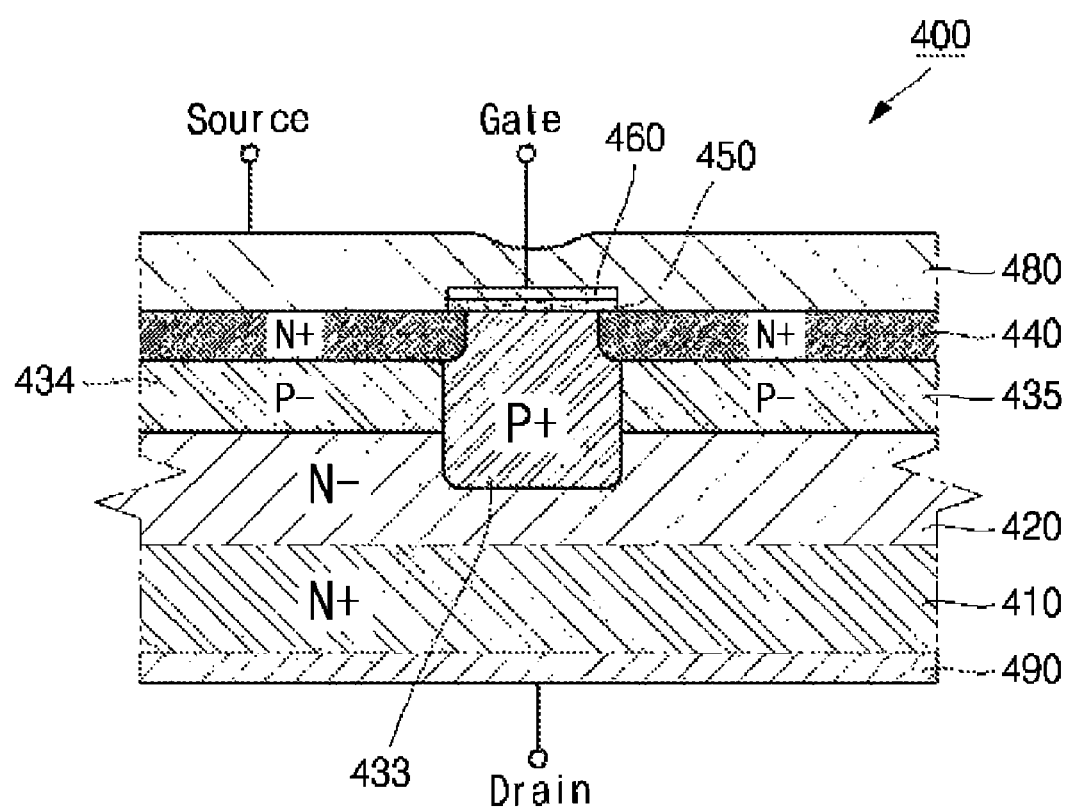

Next, referring to FIG. 12E, together with FIGS. 12A through 12D and step S5 of FIG. 11, an insulating layer 470 (see FIG. 7) is formed on the top and lateral surfaces of the gate polysilicon layer 460 and the lateral surface of the gate oxide layer 450, a source metal layer 480 is formed on surfaces of the second conductive regions 440 exposed by the insulating layer 470, and a drain metal layer 490 is formed on a bottom surface of the semiconductor substrate 410. The source metal layer 480 may be formed of aluminum or an equivalent thereof, and the drain metal layer 490 may be formed of a metal such as vanadium.

Although not shown, in order to apply a voltage to the gate polysilicon layer 460, a gate metal layer is formed in a predetermined region (called "gate pad") of the power semiconductor device 400 using aluminum or an equivalent thereof. The power semiconductor device 400 thus manufactured is mounted on a lead frame or the like, followed by wire-bonding and molding to thereby complete a semiconductor package. Here, the drain metal layer 490 is directly connected to a die paddle of the lead frame through soldering, and the source metal layer 480 and the gate metal layer are wire-bonded to a lead of the lead frame.

As is apparent from the above description, according to the inventive power semiconductor device, first conductive regions include first conductive layers and second conductive layers, and opposite ends of the first conductive layers and the second conductive layers are alternately arranged with respect to each other. Therefore, the first and second conductive layers receive gate signals from all directions (e.g., up-/down-ward/right-/left-ward) on a plane, thereby ensuring the improved transmission speed of the gate signals and insignificant deviation in the impedance of an external gate driver circuit, among device elements.

Furthermore, drift regions of an epitaxial layer extending outwardly with respect to first conductive regions have relatively large and uniform areas, and thus, an undesired current concentration phenomenon does not occur, thereby preventing device degradation.

Still furthermore, according to some embodiments of the present invention, a portion of a sphere surface junction facing a gate oxide layer has a 1.5 times greater channel width than a cylinder surface junction, thereby lowering overall drain-source on-resistance ($R_{ds(ON)}$).

Still furthermore, a gate polysilicon layer extends along an approximately S-shaped path between first and second conductive layers, and thus, the number of gate bus lines can be minimized, thereby resulting in minimal area loss and improved flow of a source current.

Still furthermore, according to some embodiments of the present invention, alternately arranged first and second conductive layers are connected by a third conductive layer, which produces a cylinder surface junction between an epitaxial layer and each of the first and second conductive layers, thereby preventing the lowering of the break-down voltage in an active region, unlike a case where an epitaxial layer and a first conductive region have a sphere surface junction where electric field concentration easily occurs, thereby causing the lowering of the break-down voltage in an active region.

In addition, it is not necessary to modify the thickness and specific resistance of an epitaxial layer in order to increase the break-down voltage of a power semiconductor device, thereby ensuring a sufficiently low drain-source on-resistance ($R_{ds(ON)}$).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A power semiconductor device comprising: a conductive low concentration epitaxial layer; first conductive regions, extending from a top surface of the epitaxial layer down to a predetermined depth in the epitaxial layer, the first conductive regions comprising a plurality of linear first conductive layers laterally spaced from each other by a predetermined distance, a plurality of linear second conductive layers laterally spaced from each other by a predetermined distance, and a third conductive layer formed in a space defined between opposite ends of the first conductive layers and the second conductive layers to connect the first conductive layers and the second conductive layers, wherein the opposite ends of the first conductive layers and the second conductive layers are alternately arranged with respect to each other and are laterally spaced from each other by a predetermined distance; second conductive regions extending down to a predetermined depth in the first and second conductive layers and formed to a smaller lateral width and depth than the first and second conductive layers so that channels are formed in the first and second conductive layers; a gate oxide layer formed on the top surface of the epitaxial layer to define first windows having a smaller width than the first conductive layers and second windows having a smaller width than the second conductive layers; and a gate polysilicon layer formed on top of the gate oxide layer.

2. The power semiconductor device of claim 1, wherein the first conductive regions further comprises first body portions formed on both sides of the first conductive layers and second body portions formed on both sides of the second conductive layers, and
wherein the first and second conductive layers are doped with a high concentration impurity and the first and second body portions are doped with a low concentration impurity.

3. The power semiconductor device of claim 2, wherein the third conductive layer is doped with the same high concentration impurity as the first and second conductive layers.

4. The power semiconductor device of claim 2, wherein the third conductive layer has a deeper depth than the first and second body portions.

5. The power semiconductor device of claim 1, wherein the first conductive regions are doped with a P or N type impurity.

6. The power semiconductor device of claim 1, wherein the second conductive regions are doped with an N or P type impurity.

7. The power semiconductor device of claim 1, wherein the epitaxial layer is doped with an N− or P− type impurity.

8. The power semiconductor device of claim 1, further comprising:
a semiconductor substrate formed on a bottom surface of the epitaxial layer and doped with an N or P type impurity; and
a drain metal layer formed on a bottom surface of the semiconductor substrate and doped with an N or P type impurity.

9. The power semiconductor device of claim 1, further comprising:
an insulating layer formed on surfaces of the gate oxide layer and the gate polysilicon layer to expose the first and second conductive regions; and
a source metal layer formed on surfaces of the first and second conductive regions exposed by the insulating layer.

10. The power semiconductor device of claim 1, wherein the opposite ends of the first conductive layers and the second conductive layers are respectively aligned along two different imaginary lines.

11. The power semiconductor device of claim 1, wherein the gate polysilicon layer extends on a plane along an S-shaped path between the first windows and the second windows.

12. The power semiconductor device of claim 1, wherein opposite ends of the first windows and the second windows are alternately arranged with respect to each other and are respectively aligned along two different imaginary lines.

13. The power semiconductor device of claim 1, wherein the epitaxial layer is formed by sequential growth of an N+ type semiconductor and an N− type semiconductor on a P++ type semiconductor substrate.

14. The power semiconductor device of claim 1, wherein the epitaxial layer is formed by sequential growth of a P+ type semiconductor and a P− type semiconductor on an N++ type semiconductor substrate.

* * * * *